United States Patent [19]

Dressen

[11] 4,281,262

[45] Jul. 28, 1981

[54] CIRCUIT ARRANGEMENT FOR EVALUATING PULSE GENERATOR SIGNALS OF VARIOUS AMPLITUDES

[75] Inventor: Anton Dressen, Dachau, Fed. Rep. of Germany

[73] Assignee: Siemens Aktiengesellschaft, Berlin & Munich, Fed. Rep. of Germany

[21] Appl. No.: 40,635

[22] Filed: May 21, 1979

[30] Foreign Application Priority Data

Jun. 26, 1978 [DE]   Fed. Rep. of Germany ....... 2827959

[51] Int. Cl.³ .......................................... H03K 5/153
[52] U.S. Cl. .................................... 307/350; 307/234;
    307/246; 307/362; 307/514; 307/597; 328/185;
    328/116
[58] Field of Search ............... 307/232, 234, 246, 294,
    307/350, 362; 328/116, 185

[56] References Cited

U.S. PATENT DOCUMENTS

| 3,786,360 | 1/1974 | Kawa ............................. 307/246 X |
| 4,019,186 | 4/1977 | Dressen et al. ..................... 346/108 |

*Primary Examiner*—John Zazworsky
*Attorney, Agent, or Firm*—Hill, Van Santen, Steadman, Chiara & Simpson

[57] ABSTRACT

A pulse generator, such as in a printing process, outputs pulses which are fed to a first threshold value circuit which generates respective rectangular pulses whose duration depends upon the time the respective pulse exceeds a first threshold value. An initially charged capacitor is discharged at a first rate in response to the leading edge of the rectangular pulse and at a second rate, twice the first rate, in response to the trailing edge of a rectangular pulse. The capacitor is connected to a second threshold value circuit which outputs pulse signals when the potential of the capacitor falls below a second threshold value.

12 Claims, 2 Drawing Figures

CIRCUIT ARRANGEMENT FOR EVALUATING PULSE GENERATOR SIGNALS OF VARIOUS AMPLITUDES

BACKGROUND OF THE INVENTION

1. Field of the Invention

The present invention relates to a circuit arrangement for evaluating pulse generator signals which have various amplitudes and which are output by a pulse generator and for producing pulse signals from the pulse generator signals.

2. Description of the Prior Art

Pulse signals are necessary for the operation of quite diverse apparatus. One example of the use of pulse signals is in a printer. In a printer, the point in time must be determined at which the printing of the character or the printing of a portion of the character is to be executed. Therefore, a pulse signal must be produced, occurring at that point in time, which must be fed to a control for releasing the printing mechanism. In order to produce such a pulse signal, a path generator or pulse generator is necessary which, for example, is arranged in parallel to the line to be printed and which outputs a signal along the line with each printing point, the signal being transformed into a pulse signal. Such a generator can be necessary, for example, in a series printer.

The pulse generator, for example, can consist of a glass tube in which marks are provided for each printing point. A light beam simultaneously impinges upon the glass tube alongside of the line and the light beam only enters the glass tube at the point of the marks. The light which enters is reflected in the tube and fed to photoconductors which produce an electrical signal from the light received. This signal, subsequently called the pulse generator signal, can then be converted into a pulse signal. Other embodiments of pulse generators are also possible.

SUMMARY OF THE INVENTION

The signals output by a pulse generator normally have different amplitudes and different base widths. In order to produce the pulse signals from these pulse generator signals, a circuit arrangement is required which evaluates the center of a pulse generator signal independently of the amplitude thereof.

The underlying object of the invention, therefore, is to provide a circuit arrangement for performing such an independent evaluation.

The aforementioned object is achieved in that a threshold value circuit is provided to which pulse generator signals are fed and which emits rectangular pulses, each rectangular pulse having a length which is dependent upon the time duration over which the pulse generator signal exceeds the threshold value of the threshold value circuit. An initially charged capacitor is provided and connected to a discharge circuit in which the capacitor is discharged at a first discharge rate from the initial value in response to the leading edge of a rectangular pulse and is discharged at a greater rate, for example twice the first discharge rate, in response to the trailing edge of a rectangular pulse. An additional threshold circuit is connected to the discharge circuit and produces a pulse signal, as an output signal, when the potential of the capacitor falls below a fixed threshold value.

Advantageously, the discharge circuit contains a first discharge circuit having a first discharge resistor and a second discharge circuit having a second discharge resistor. The first discharge circuit is connected to the capacitor with the aid of the first switch when the leading edge of the rectangular pulse occurs. The second discharge circuit is additionally connected to the capacitor by a second switch when the trailing edge of the rectangular pulse occurs. The discharge circuit also includes a charging circuit for recharging the capacitor to the initial value upon occurrence of the pulse signal.

The first switch can readily be designed to include a first flip-flop which is operated from a first state into a second state by the first threshold value circuit when the leading edge of the rectangular pulse occurs and which is reset when the pulse signal occurs. Additionally, a diode circuit can be arranged between the output of the flip-flop and the first discharge circuit.

Likewise, the second switch can include a second flip-flop and a diode circuit. The second flip-flop is operated from its first state into a second state by the first threshold value circuit when the trailing edge of the pulse signal occurs. The diode circuit contains a diode arranged between the capacitor of the discharge circuit and the second discharge resistor of the second discharge circuit and contains at least one additional diode arranged between the second discharge circuit and the second flip-flop.

Advantageously, the first switch can simultaneously form the charging circuit for the capacitor.

One input of the second threshold value circuit is advantageously connected to the capacitor and the output of the second threshold value circuit is connected to the reset inputs of the first and second flip-flops.

An RC element can be connected between the output of the first threshold value circuit and a blocking input of the first threshold value circuit as an interference suppression device so that the first threshold circuit is temporarily blocked for a predetermined interval in response to the leading edge of a pulse. In this manner, interfering pulses superposed on the pulse generator signal can be suppressed and not effect premature reset of the second flip-flop.

A particular advantage of a circuit arrangement constructed in accordance with the present invention is that it is therefore insensitive to high frequency interference pulses.

BRIEF DESCRIPTION OF THE DRAWINGS

Other objects, features and advantages of the invention, will be best understood from the following detailed description, taken in conjunction with the accompanying drawings, on which.

DESCRIPTION OF THE PREFERRED EMBODIMENTS

Figure 1:
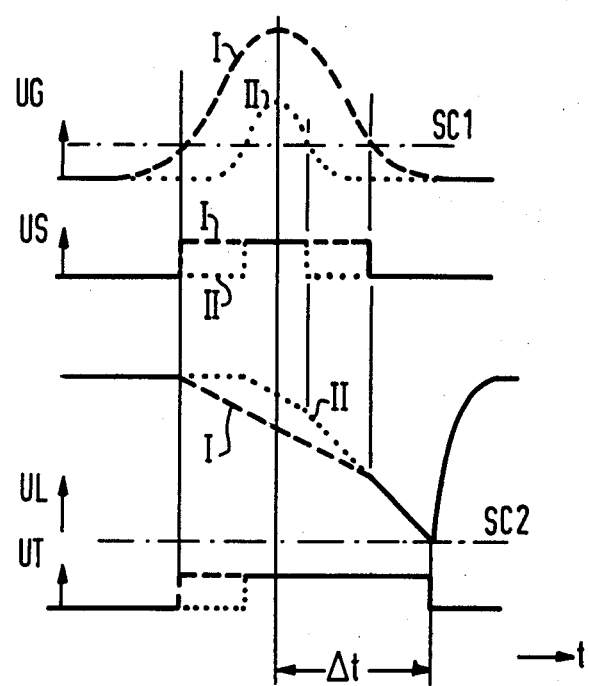
FIG. 1 is a voltage diagram which illustrates the principle operating characteristics of a circuit arrangement constructed in accordance with the present invention, FIG. 1 being referenced to FIG. 2.

In FIG. 1 voltage signals are plotted at various points of the circuit arrangement and are illustrated above a time axis t. With the aid of these signals, the principle operating characteristics of the circuit arrangement will be explained.

The pulse generator signals output by a pulse generator are referenced UG. The signals UG have a bell-shaped form in the exemplary embodiment of FIG. 1. FIG. 1 illustrates two possible wave forms of the pulse generator signal UG. The one pulse generator signal I has a large amplitude and a large base width, while the second pulse generator signal II has a small amplitude and a small base width.

The pulse generator signal is fed to a threshold value circuit having a threshold value SC1. As soon as the pulse generator signal UG exceeds the threshold value SC1, the leading edge of a rectangular pulse appears at the output of the threshold value circuit, and when the pulse generator signal falls below the threshold value SC1, the rectangular pulse is provided with a trailing edge and returns to its initial value at the output of the threshold value circuit. The rectangular pulse formed is referenced US.

The discharge of a capacitor is introduced with the first discharge circuit in response to the leading edge of the pulse US. When the trailing edge of the pulse US occurs, then the discharge current of the capacitor is precisely doubled. These conditions are illustrated for a voltage UL of the capacitor. It is readily apparent that the curves for the voltage UL of the capacitor reunite after the trailing edge occurs regardless of the different pulse widths of the pulses US. The presupposition is that the pulses lie chronologically symmetrically; however, they can have different widths. If the voltage UL reaches a second threshold value SC2, the pulse signal UT is produced, which begins with the trailing edge of a pulse in the present example. The trailing edge of the pulse is displaced from the center of the pulse generator signal by a specific constant time Δt. This, of course, must be taken into consideration when using the pulse signal.

Figure 2:
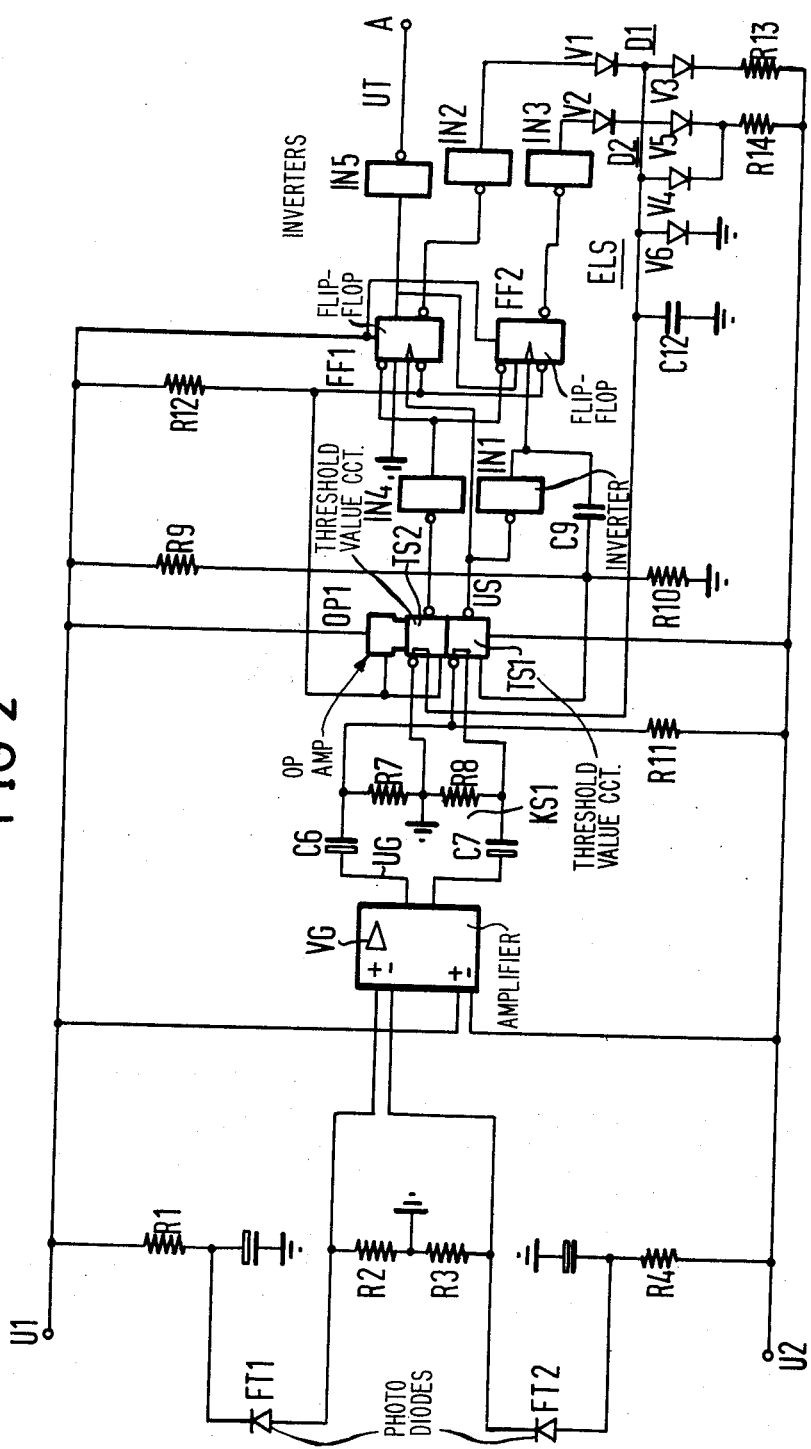
FIG. 2 is a schematic circuit diagram of a circuit arrangement constructed in accordance with the present invention.

FIG. 2 illustrates a circuit arrangement for realizing the operation illustrated in FIG. 1 and discussed above. A path generator is employed in FIG. 2 as a pulse generator which, for example, is described in the German published application No. 2,512,349. In this published application, a light beam impinges upon a path generator which is provided with marks. Only at the point of the marks can the light beam enter the path generator, for example, a glass rod. The light is reflected in the path generator and reaches photodiodes. The photodiodes are referenced FT1 and FT2 in FIG. 1. The photodiodes output signals corresponding in form to the signals UG of FIG. 1. Whenever the photodiode FT1 is illuminated, a current from an operating voltage source U1 of, for example, 5 volts, flows toward ground by way of a resistor R1, the photodiode FT1 and a resistor R2. Thereby, a voltage arises across the resistor R2, which voltage is fed to an amplifier VG. The amplifier VG is constructed as a differential amplifier. If light impinges upon the photodiode FT2, a current flows from ground toward the operating voltage U2 by way of a resistor R3, the photodiode FT2 and a resistor R4. The potential U2, for example, is −5 volts. Thereby, a voltage is formed across the resistor R3 and is fed to the amplifier VG, in particular to the inverting input thereof.

The amplifier VG amplifies the signal received at its inputs and produces the pulse generator signal UG. The signal output by the photodiode FT1 and FT2 are therefore added. The pulse generator signals UG therefore appear at the output of the amplifier VG and are fed to a circuit KS1. The d.c. voltage component contained in the pulse generator signal UG is removed with the circuit KS1. The circuit KS1 comprises a pair of capacitors C6 and C7 and a pair of resistors R7 and R8.

The circuit KS1 is connected to an operational amplifier OP1 which contains two threshold value circuits TS1 and TS2. The pulse generator signal UG is fed to the threshold value circuit TS1. The threshold value circuit TS1 outputs a rectangular pulse US. The threshold value circuit TS1 is therefore provided with a threshold SC1. Whenever the pulse generator signal UG exceeds the threshold SC1, the leading edge of the rectangular pulse US occurs and when the pulse generator signal UG falls below the threshold value SC1, the trailing edge of the rectangular pulse US is produced.

The pulse US is directly fed to a first flip-flop FF1, and to a second flip-flop FF2 by way of an inverter IN1. If the leading edge of the pulse US appears at the output of the first threshold value circuit TS1, the flip-flop FF1, in the exemplary embodiment, is reset. This means that the leading edge of a rectangular pulse appears at the inverting output $\overline{Q1}$ of the flip-flop FF1. The output $\overline{Q1}$ of the flip-flop FF1 is connected to an additional inverter IN2 which is connected to a first diode circuit D1 which includes a pair of diodes V1 and V3. The flip-flop FF1 and the diode circuit D1 are hereinafter referred to as a first switch.

The output of the first threshold value circuit TS1 is connected to the second flip-flop FF2 by way of the inverter IN1. Thereby, the flip-flop FF2 is reset when the trailing edge of the rectangular pulse US occurs. The inverting output Q2 of the second flip-flop FF2 is connected to a second diode circuit D2 by way of an inverter IN3. The second diode circuit comprises a plurality of diodes V2, V4 and V5. The second flip-flop FF2 and the second diode circuit D2 are hereinafter referred to as the second switch.

The first switch and the second switch are components of a discharge circuit ELS which is connected to and may be considered to contain a capacitor C12. The discharge circuit ELS also includes a first discharge circuit having a first discharge resistor R13 and a second discharge circuit having a second discharge resistor R14. The output of the discharge circuit ELS is connected to the second threshold value circuit TS2. When the voltage UL of the capacitor C12 falls below the threshold value SC2 of the threshold value circuit TS2, the edge of a pulse appears at the output of the threshold value circuit TS2, which pulse is fed to the flip-flops FF1 and FF2 by way of an inverter IN4. The flip-flops FF1 and FF2 are then reset into their initial states by the leading edge of this pulse. The edge of a pulse is thereby formed at the output Q1 which is connected to an output A of the circuit arrangement by way of an additional inverter IN5. There, the voltage UT occurs, which is the output pulse signal produced by the circuit arrangement.

The operating characteristics of the circuit arrangement are to be considered in the following. Before the photodiodes FT1 and FT2 are illuminated and, there, produce the pulse generator signals UG, the capacitor C12 of the discharge circuit ELS is charged to its initial value of, for example, 0.7 volt. The initial value is fixed by way of a diode V6. Charging is obtained in that the first flip-flop FF1 is set and thus the inverting output $\overline{Q1}$ is negative. This negative potential is inverted by the inverter IN2 and therefore become positive so that the diode D1 of the diode circuit D1 is rendered conductive. Therefore, the capacitor C12 can be charged to its initial value. The second switch comprising the flip-flop FF2 and the diode circuit D2 is not influenced by this operation as the diodes V5 and V2 are poled in the blocking direction.

If the photodiodes FT1 and FT2 are illuminated, voltages arising across the resistors R2 and R3 are fed to the amplifier VG. The amplifier VG amplifies these voltages and produces the pulse generator signal UG. The pulse generator signal UG is fed to the first threshold value circuit TS1. The threshold value circuit TS1 produces the rectangular pulse US. With the aid of the leading edge of the rectangular pulse US, the first flip-flop FF1 is reset. This means that the inverting output $\overline{Q1}$ of the flip-flop FF1 becomes positive. This potential is inverted by the inverter IN2, thus becomes negative, so that the diode V1 of the diode circuit D1 is blocked. Now, the capacitor C12 can be discharged by way of the diode V3 and the first discharge resistor R13.

If the trailing edge of the pulse US occurs, the flip-flop FF2 is also reset. In response to this action, the output $\overline{Q2}$ becomes positive. The output of the inverter IN3 becomes negative so that the diodes V2 and V5 of the diode circuit D2 are blocked. Therefore, the diode V4 of the diode circuit D2 can become conductive, i.e. the series circuit of the diode V4 and of the second discharge resistor R14 is connected in parallel to the series circuit of the diode V3 and the first discharge resistor R13. Therefore, the capacitor C12 is simultaneously discharged by way of the first discharge resistor R13 and the second discharge resistor R14. If the discharge resistors are equally dimensioned, the discharge current is doubled by connecting the second discharge resistor R14.

If the voltage UL has dropped across the capacitor C12 to such an extent that it falls below the threshold value SC2, the threshold value circuit TS2 outputs a signal which is inverted and fed to the two flip-flops FF1 and FF2. This causes a setting of the flip-flops FF1 and FF2. Consequently, the edge of the pulse signal occurs at the output A and, moreover the diode V1 becomes again conductive and the capacitor C12 can charge to its initial value. Therefore, the initial state of the circuit arrangement is obtained.

The diode V1 of the first diode circuit D1 is employed to decouple the inverter IN2 from the capacitor C12 when the flip-flop FF1 is reset. If the diode V1 is not present, the potential across the capacitor C12 would be influenced by the output potential of the inverter IN2. The diode V4 is added in order to prevent a discharge of the capacitor C12 by way of the resistor R14 for such a length of time until the flip-flop FF2 is also reset. The diodes V2 and V5 are also decoupling diodes.

A resistor R11, which is connected to an input of the first threshold value circuit TS1, is connected to a bias voltage, i.e. to the potential U2. Thereby, the occurrence of sawtooth waves are prevented when the pulse generator signal is not present.

With the aid of an RC combination, comprising a pair of resistors R9 and R10 and a capacitor C9, connected between the output of the first threshold value circuit TS1 and an input of the first threshold value circuit, the threshold value circuit is blocked for a certain period of time, for example, 500 ns after the occurrence of the leading edge of the pulse. Interfering pulses superposed on the pulse generator pulses are thereby prevented from prematurely effected resetting of the second flip-flop FF2.

The remaining capacitors and resistors illustrated in FIG. 2 are used for establishing or setting working points. As they are insignificant with respect to the invention, a detail description of the same is not provided herein.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A circuit arrangement for evaluating pulse signals of different amplitudes and producing output pulses therefrom, comprising:
   a first threshold value means for receiving the pulse signals and, producing rectangular pulses having pulse widths dependent on the durations of the pulse signals above a first threshold value;
   discharge means including a capacitor, connected to said first threshold means and operable in response to the leading edge of a rectangular pulse to discharge said capacitor from an initial value at a first discharge rate and at a second discharge rate which is twice the first discharge rate in response to the trailing edge of a rectangular pulse; and
   a second threshold value means connected to said discharge means and operable to produce an output pulse in response to the potential of said capacitor falling below a second threshold value.

2. The circuit arrangement of claim 1, wherein said discharge means comprises:
   resistance means including a pair of resistors; and
   means responsive to said leading and trailing edges respectively to connect said resistors to said capacitor and sequentially in parallel with each other to sequentially form two discharge paths.

3. The circuit arrangement of claim 1, wherein said discharge means comprises:
   a first discharge circuit including first discharge resistor means connectible to said capacitor and first switch means responsive to the leading edge of a rectangular pulse to connect said capacitor and said first resistor means in a first discharge path; and
   a second discharge circuit including second discharge resistor means connectible to said capacitor and second switch means responsive to the trailing edge of a rectangular pulse to connect said capacitor and said second resistor means in a second discharge path; and
   charging means connected to said capacitor and to said discharge means and operable in response to the leading edge of an output pulse to charge said capacitor to said initial value.

4. The circuit arrangement of claim 3, wherein said first switch means comprises:
   a flip-flop responsive to be set in response to the leading edge of a rectangular pulse and reset in response to the trailing edge of a rectangular pulse; and
   a diode circuit connected between said flip-flop and said first resistance means.

5. The circuit arrangement of claim 3, wherein said second switch means comprises:

a flip-flop responsive to be set in response to the trailing edge of a rectangular pulse and reset in response to the leading edge of an output pulse; and a diode circuit connected between said flip-flop and said first resistance means.

6. The circuit arrangement of claim 3, wherein: said first switch means comprises a first flip-flop responsive to the leading edge of a rectangular pulse and reset in response to the trailing edge of a rectangular pulse;

a first diode circuit connected between said first flip-flop and said first resistance means;

said second switch means comprises a second flip-flop responsive to the trailing edge of a rectangular pulse and reset in response to the leading edge of an output pulse; and a second diode circuit connected between said second flip-flop and said second resistance means.

7. The circuit arrangement of claim 6, wherein said first switch means comprises said charging means.

8. The circuit arrangement of claim 6, wherein:

each of said flip-flops includes a reset input; and said second threshold value means includes an input connected to said capacitor and an output connected to said reset inputs of said flip-flops.

9. The circuit arrangement of claim 6, wherein said first threshold value means includes a signal input and a blocking input; and comprising interference suppression means connected between said signal and blocking inputs for blocking said first threshold value means for a predetermined time interval after receipt of a leading edge of a pulse signal.

10. A circuit arrangement for evaluating pulse signals of different amplitudes and producing output signals therefrom, comprising:

a capacitor;

charging means for charging said capacitor to a predetermined initial value;

a first threshold circuit for receiving the pulse signals and producing respective rectangular pulses having widths equal to the time the amplitude of the respective pulse signal is above a first threshold value;

a first discharge circuit connected to said capacitor and to said first threshold circuit and including first means responsive to a leading edge of a rectangular pulse to connect said capacitor in a first discharge path;

a second discharge circuit connected to said capacitor and to said first threshold circuit and including second means responsive to a trailing edge of a rectangular pulse to connect said capacitor in a second discharge path to increase the discharge rate; and a second threshold circuit connected to said capacitor and operable in response to the potentials at said capacitor falling below a second predetermined threshold.

11. The circuit arrangement of claim 10, wherein:

said first discharge circuit includes a first resistor in said first discharge path;

said second discharge circuit includes a second resistor in said second discharge path; and said first and second means connect said first and second resistors in parallel.

12. The circuit arrangement of claim 10, wherein:

said first discharge circuit includes a first flip-flop, first diode means connected to the output of said first flip-flop and to said capacitor, and a first resistor connected to said first diode means; and said second discharge circuit includes a second flip-flop, second diode means connected to the output of said second flip-flop and to said capacitor, and a second resistor connected to said second diode means, said first and second resistors including a common terminal and said first and second diode means operable to connect said first and second resistors in parallel with each other and in series with said capacitor.

* * * * *